United States Patent
Fu

(10) Patent No.: US 11,728,814 B1
(45) Date of Patent: Aug. 15, 2023

(54) VOLTAGE DROOP MONITOR AND VOLTAGE DROOP MONITORING METHOD

(71) Applicant: Taiwan Semiconductor Manufacturing Company, Ltd., Hsinchu (TW)

(72) Inventor: Chin-Ming Fu, Hsinchu County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/832,692

(22) Filed: Jun. 6, 2022

(51) Int. Cl.
*H03L 7/081* (2006.01)
*H04L 7/00* (2006.01)
*H04L 7/033* (2006.01)
*H03L 7/091* (2006.01)

(52) U.S. Cl.
CPC .......... *H03L 7/0814* (2013.01); *H03L 7/091* (2013.01); *H04L 7/0025* (2013.01); *H04L 7/033* (2013.01)

(58) Field of Classification Search
None
See application file for complete search history.

(56) References Cited

U.S. PATENT DOCUMENTS 11,211,935 B2 *  12/2021  Bang ................. H03L 7/0814
2012/0187991 A1 *  7/2012  Sathe ................. H03K 5/135
327/158

* cited by examiner

*Primary Examiner* — Cassandra F Cox
(74) *Attorney, Agent, or Firm* — JCIPRNET

(57) ABSTRACT

The disclosure provides a voltage droop monitor (VDM) and a voltage droop monitoring method. The method includes: receiving a first reference clock signal and delaying the first reference clock signal as a first clock signal; delaying the first clock signal as a corresponding second clock signal; receiving the corresponding second clock signal from the corresponding first DCDL and generating a corresponding third clock signal via modifying a phase of the corresponding second clock signal; receiving the corresponding third clock signal; receiving a second reference clock signal; and collectively outputting a TDC code combination based on the second reference clock signal and the corresponding third clock signal, wherein the TDC code combination varies in response to a voltage variation of a to-be-monitored voltage.

20 Claims, 6 Drawing Sheets

US 11,728,814 B1

VOLTAGE DROOP MONITOR AND VOLTAGE DROOP MONITORING METHOD

BACKGROUND

In advanced process nodes, circuits become more voltage sensitive due to lower and lower power supply requirement. Voltage droop monitor (VDM) is required to monitor" voltage variation to see if the voltage variation will impact circuit's function or performance.

In past, it is difficult to take care of VDM's requirement on voltage resolution, cover range and response time. In addition, reference voltage requirement is another issue to increase placement difficulty, and analog approaches of VDM also have issues on area scaling and porting friendly when process migration.

Conventionally, voltage-controlled oscillator (VCO) and analog-digital converter (ADC) are used to monitor voltage regulator.

VCO type of VDM use the counters to compare frequency of VCO under sensed VDD and the reference VDD to derive sensed voltage. However, VCO type of VDM needs longer latency for counter accumulation, and the sensed voltage resolution will be a trade-off for sampling rate. Finer voltage resolution needs lower sampling rate to compensate. VCO's frequency also limits voltage resolution and sampling rate.

ADC type of VDM use ADC to compare voltage difference between sensed VDD and the reference VDD and convert to digital codes refer to sensed voltage. However, ADC type of VDM also suffer limitation on resolution and sampling rate on analog-digital converter. Besides reference voltage generation and offset of comparator is another issue of ADC.

Moreover, the application of VDM is limited due to the need of reference voltages. In this case, designers couldn't place VDM at will due to additional voltage source requirement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
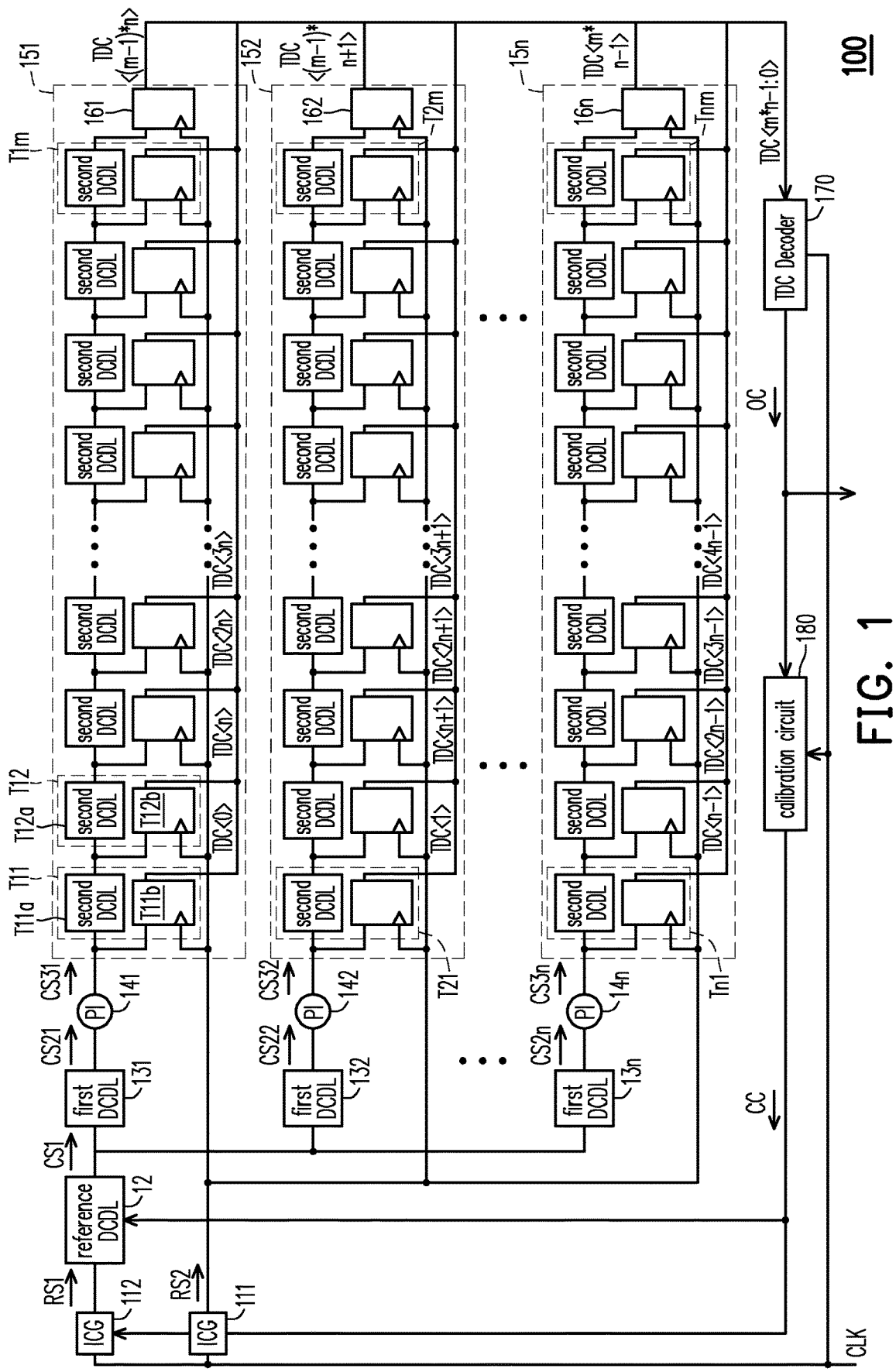
FIG. 1 shows a schematic diagram of a VDM according to an embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a schematic diagram of a VDM according to an embodiment of the disclosure. In FIG. 1, the VDM 100 includes a first integrated clock signal gating (ICG) cell 111, a second ICG cell 112, a reference digitally-controlled delay line (DCDL) 12, a plurality of first DCDLs 131-13$n$, a plurality of phase interpolators (PI) 141-14$n$, a plurality of time-to-digital converters (TDC) 151-15$n$, a TDC decoder 170, and a calibration circuit 180. In the first DCDLs 131-13$n$, the PIs 141-14$n$, and the TDC sets 151-15$n$ have the same amount, i.e., n, wherein n is a positive integer.

In the embodiments of the disclosure, the reference DCDL 12 receives a first reference clock signal RS1 and delays the first reference clock signal RS1 as a first clock signal CS1. In one embodiment, the reference DCDL 12 delays the first reference clock signal RS1 as the first clock signal CS1 based on a delay parameter. In one embodiment, the delay parameter can be controlled by the calibration circuit 180, such that the reference DCDL 12 may increase/decrease the delay applied to the first reference clock signal RS1 based on the control of the calibration circuit 180, and the details thereof would be discussed later.

In one embodiment, the first DCDLs 131-13$n$ are coupled to the reference DCDL 12, wherein each first DCDL 131-13$n$ delays the first clock signal CS1 as a corresponding second clock signal. For example, the first DCDL 131 delays the first clock signal CS1 as the corresponding second clock signal CS21, the first DCDL 132 delays the first clock signal CS1 as the corresponding second clock signal CS22, and the first DCDL 13$n$ delays the first clock signal CS1 as the corresponding second clock signal CS2$n$, but the disclosure is not limited thereto.

In the embodiments of the disclosure, the PIs 141-14$n$ are respectively coupled to the first DCDLs 131-13$n$. Each of the PIs 141-14$n$ receives the corresponding second clock signal from the corresponding first DCDL and generates a corresponding third clock signal via modifying a phase of the corresponding second clock signal. In the embodiments, each of the PI 141-14$n$ modifies the phase of the corresponding second clock signal based on a corresponding phase step, wherein the corresponding phase step of an i-th PI among the PIs 141-14$n$ is (i−1)/n of a specific DCDL delay step, wherein i is an integer ranges from 1 to n. In the embodiments of the disclosure, each of the PI 141-14n can be an n-step PI, and the specific DCDL delay step can be determined based on the structure of each TDC set 151-15n, which would be discussed later.

In one embodiment, the PI 141 coupled to the first DCDL 131 receives the second clock signal CS21 from the first DCDL 131 and generates a third clock signal CS31 via modifying a phase of the second clock signal CS21. In this case, the PI 141 (i.e., the $1^{st}$ PI) modifies the phase of the second clock signal CS21 based on a corresponding phase step, which is 0 (i.e., (1-1)/n) of the specific DCDL delay step. Accordingly, there would be no phase difference between the third clock signal CS31 and the second clock signal CS21.

In one embodiment, the PI 142 coupled to the first DCDL 132 receives the second clock signal CS22 from the first DCDL 132 and generates a third clock signal CS32 via modifying a phase of the second clock signal CS22. In this case, the PI 142 (i.e., the 2nd PI) modifies the phase of the second clock signal CS22 based on a corresponding phase step, which is 1/n (i.e., (2-1)/n) of the specific DCDL delay step. Accordingly, third clock signal CS31 will be lagged to the second clock signal CS21 by 1/n of the specific DCDL delay step.

In one embodiment, the PI 14n coupled to the first DCDL 13n receives the second clock signal CS2n from the first DCDL 13n and generates a third clock signal CS3n via modifying a phase of the second clock signal CS2n. In this case, the PI 14n (i.e., the $n^{th}$ PI) modifies the phase of the second clock signal CS2n based on a corresponding phase step, which is (n-1)/n of the specific DCDL delay step. Accordingly, third clock signal CS3n will be lagged to the second clock signal CS2n by (n-1)/n of the specific DCDL delay step.

In the embodiments of the disclosure, the TDC sets 151-15n respectively corresponds to the PIs 141-14n. In one embodiment, a first input of each of the TDC set 151-15n is coupled to the corresponding PI and receives the corresponding third clock signal, and a second input of each of the TDC sets 151-15n receives a second reference clock signal RS2, wherein the details of the second reference clock signal RS2 would be discussed later.

For example, a first input of the TDC set 151 corresponding to the PI 141 receives the third clock signal CS31, and a second input of the TDC set 151 receives the second reference clock signal RS2. A first input of the TDC set 152 corresponding to the PI 142 receives the third clock signal CS32, and a second input of the TDC set 152 receives the second reference clock signal RS2. A first input of the TDC set 15n corresponding to the PI 14n receives the third clock signal CS3n, and a second input of the TDC set 15n receives the second reference clock signal RS2.

In the embodiments of the disclosure, the TDC sets 151-15n collectively output a TDC code combination based on the second reference clock signal and the corresponding third clock signal of each of the TDC set 151-15n, and the TDC code combination varies in response to a voltage variation of a to-be-monitored voltage.

In the embodiments of the disclosure, the to-be-monitored voltage can be the VDD (e.g., the operating voltage) applied to the DCDLs mentioned in the application, but the disclosure is not limited thereto.

In FIG. 1, the TDC decoder 170 is coupled to an output of each of the TDC set 151-15n. In the embodiments of the disclosure, the TDC decoder 170 receives the TDC code combination and a phase locked loop (PLL) clock signal CLK and converts the TDC code combination into a TDC output code OC corresponding to the to-be-monitored voltage.

In one embodiment, the length of the TDC code combination can be m*n, which can be represented by TDC<m*n-1:0>. In the TDC code combination, a p-th (p is an integer between 1 and m*n) bit of the TDC code combination can be represented by TDC<p-1>. For example, the $1^{st}$ bit of the TDC code combination can be represented by TDC<0>, the $2^{nd}$ bit of the TDC code combination can be represented by TDC<1>, and the (m*n)-th bit of the TDC code combination can be represented by TDC<m*n-1>, but the disclosure is not limited thereto.

In one embodiment, the TDC decoder 170 can be used to convert the TDC code combination into a binary code as the TDC output code. In one embodiment, the binary code corresponding to the considered TDC code can be the number of the "0" in the TDC code combination. For example, if m and n are both 2, and the TDC code combination is "1100", the TDC decoder 170 may convert this TDC code combination into a binary code of "2" as the TDC output code since the number of "0" in "1100" is 2. For example, if m and n are both 3, and the TDC code combination is "111000000", the TDC decoder 170 may convert this TDC code combination into a binary code of "6" as the TDC output code since the number of "0" in "111000000" is 6, but the disclosure is not limited thereto.

In some embodiments, the voltages corresponding to different TDC output codes can be established in a mapping table in advance. Accordingly, once a TDC output code is obtained, the corresponding voltage can be directly retrieved in the mapping table without further measurement, but the disclosure is not limited thereto.

For example, assuming that the when the TDC output code is a binary code of 32, it represent that the to-be-monitored voltage has no voltage variation in the current cycle. In one embodiment, if the TDC output code becomes another binary code of 34, the voltage variation corresponding toe the binary code of 34 can be measured in advance and recorded in the mapping table. For example, if the binary code of 34 represents that the to-be-monitored voltage has been increased by 10 mV, the corresponding relationship therebetween can be recorded in the mapping table. In this case, when the TDC output code is determined to be 34 again, it can be known that the to-be-monitored voltage has been increased by 10 mV according to the information in the mapping table, but the disclosure is not limited thereto.

In FIG. 1, the calibration circuit 180 is coupled to the TDC decoder 170, wherein the calibration circuit 180 receives the TDC output code OC and the PLL clock signal CLK, and accordingly provides a calibration signal CC to the reference DCDL 12. In one embodiment, the calibration signal CC calibrates the delay parameter used by the reference DCDL 12 for delaying the first reference clock signal RS1, and the details thereof would be discussed later.

In FIG. 1, each of the TDC set 151-15n includes a plurality of serially connected TDC units and a reference D-flip flop, wherein the reference D-flip flop is connected to a last TDC units among the serially connected TDC units. For example, the TDC set 151 includes a plurality of serially connected TDC units T11-T1m (wherein m is the number of TDC units in each TDC set) and a reference D-flip flop 161 connected to the TDC unit T1m (i.e., the last TDC unit among the TDC units T11-T1m); the TDC set 152 includes a plurality of serially connected TDC units T21-T2m and a reference D-flip flop 162 connected to the TDC unit T2m (i.e., the last TDC unit among the TDC units T21-T2m); and the TDC set 15n includes a plurality of serially connected TDC units Tn1-Tnm and a reference D-flip flop 16n connected to the TDC unit Tnm (i.e., the last TDC unit among the TDC units Tn1-Tnm).

In the embodiments of the disclosure, each of the TDC units in the TDC sets 151-15n outputs a TDC code in response to the second reference clock signal RS2. In FIG. 1, the j-th TDC unit of the k-th TDC set includes a second DCDL and a D-flip flop. The second DCDL receives a specific clock signal and delays the specific clock signal. The D-flip flop outputs one TDC code of the TDC combination in response to the specific clock signal and the second reference clock signal.

In an embodiment where j is 1, the specific clock signal received by the second DCDL of j-th TDC unit of the k-th TDC set is the corresponding third clock signal provided by the corresponding PI. For example, the TDC unit T11 (i.e., the $1^{st}$ TDC unit (j=1) of the $1^{st}$ TDC set) includes a second DCDL T11a and a D-flip flop T11b, wherein the specific clock signal received by the second DCDL T11a is the third clock signal CS31 provided by the PI 141.

In another embodiment where j is between 2 and m, the specific clock signal received by the second DCDL of j-th TDC unit of the k-th TDC set is an outputted clock signal from the second DCDL of a (j−1)-th TDC unit of the k-th TDC set. For example, the TDC unit T12 (i.e., the $2^{nd}$ TDC unit (j=2) of the $1^{st}$ TDC set) includes a second DCDL T12a and a D-flip flop T12b, wherein the specific clock signal received by the second DCDL T12a is the outputted clock signal from the second DCDL T11a.

In FIG. 1, the first ICG cell 111 is coupled to the TDC sets 151-15n and the calibration circuit 180, wherein the first ICG cell 111 receives the PLL clock signal CLK, and retrieves a first pulse from the PLL clock signal CC as the second reference clock signal RS2. In one embodiment, the second reference clock signal RS2 can be used as a sampling clock signal for sampling the voltage of the second DCDL in each TDC unit, such that the bits in the TDC code combination can be generated.

The second ICG cell 112 receives the PLL clock signal CLK and the calibration signal CC, and retrieves a plurality of second pulses from the PLL clock signal CLK as the first reference clock signal RS1 based on the calibration signal CC. For example, if only two pulses of the PLL clock signal CLK are needed for the operations of the reference DCDL 12, the second ICG cell 112 can be configured to retrieve the required two pulses of the PLL clock signal CLK as the first reference clock signal CS1, but the disclosure is not limited thereto.

Figure 2:
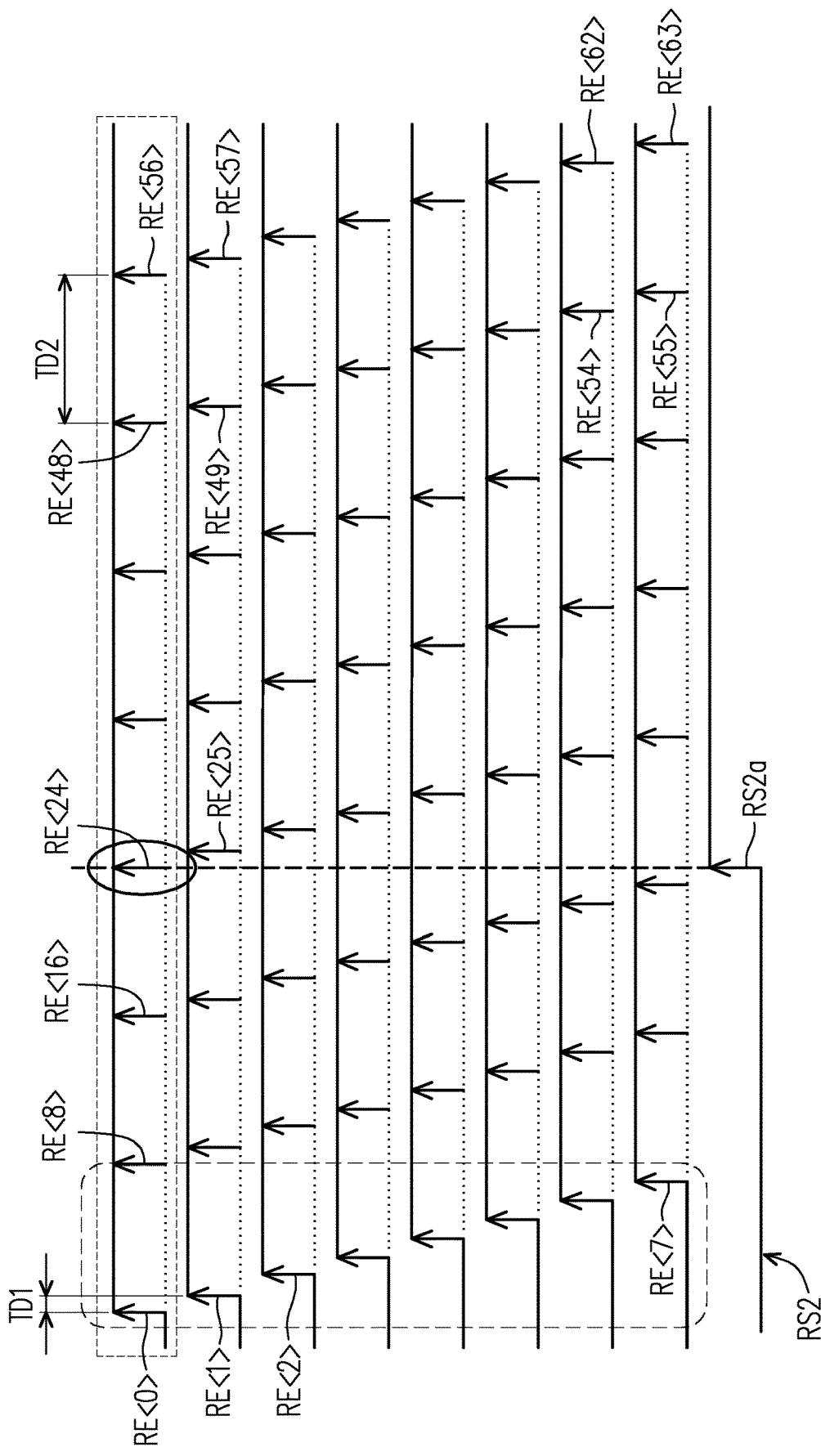
FIG. 2 shows a schematic diagram of the rising edges corresponding to the second DCDL in each TDC unit according to FIG. 1.

See FIG. 2, which shows a schematic diagram of the rising edges corresponding to the second DCDL in each TDC unit according to FIG. 1.

In FIG. 2, it is assumed that the considered m and n are both 8, which represents that there are 8 serially connected TDC units in each of the 8 TDC sets.

In the embodiments of the disclosure, a rising edge RE<q> is the rising edge corresponding to TDC<q−1>, wherein q is an integer between 0 and 63 (i.e., m*n−1).

In the embodiments of the disclosure, with the operations performed by the PIs 141-14n, the delay difference between the rising edge RE<r> and the rising edge RE<r+1> would be 1/n of the specific DCDL delay step, wherein r is an integer between 1 and m*n−1. For example, the delay difference TD1 between the rising edge RE<1> and the rising edge RE<0> is 1/n of the specific DCDL delay step; the delay difference between the rising edge RE<2> and the rising edge RE<1> is 1/n of the specific DCDL delay step; the delay difference between the rising edge RE<8> and the rising edge RE<7> is 1/n of the specific DCDL delay step; the delay difference between the rising edge RE<57> and the rising edge RE<56> is 1/n of the specific DCDL delay step; and the delay difference between the rising edge RE<63> and the rising edge RE<62> is 1/n of the specific DCDL delay step.

In the embodiments of the disclosure, the delay difference between the rising edge RE<r> and the rising edge RE<r+1> can be adjusted by assigning n and the specific DCDL delay step to be any desired value of the designer.

In the embodiments of the disclosure, each of the first DCDL 131-13n includes a plurality of first stages, the second DCDL of each TDC unit includes a plurality of second stages, and a number of the first stages is larger than a number of the second stages.

In the embodiments of the disclosure, the specific DCDL delay step is determined based on at least one activated stage of the second stages of the second DCDL of each TDC unit. In one embodiment, the specific DCDL delay step is a multiplication of a number of the at least one activated stage, a unit delay of the second DCDL (referred to as UD), and 1/n. For example, if the second DCDL of each TDC unit includes 4 second stages and one of the second stages is activated, the specific DCDL delay step would be (1*UD)/n. If the second DCDL of each TDC unit includes 4 second stages and two of the second stages are activated, the specific DCDL delay step would be (2*UD)/n, but the disclosure is not limited thereto.

Therefore, the delay difference between the rising edge RE<r> and the rising edge RE<r+1> can be adjusted by using different values of n and different number of activated second stages in the second DCDL, but the disclosure is not limited thereto.

In addition, the delay difference between the rising edge RE<s> and the rising edge RE<s-n> would be the specific DCDL delay step, wherein s is an integer between n and m*n−1. For example, the delay difference TD2 between the rising edge RE<56> and the rising edge RE<48> is the specific DCDL delay step; the delay difference between the rising edge RE<57> and the rising edge RE<49> is the specific DCDL delay step; the delay difference between the rising edge RE<62> and the rising edge RE<54> is the specific DCDL delay step; and the delay difference between the rising edge RE<63> and the rising edge RE<55> is the specific DCDL delay step.

In this case, the delay difference between the rising edge RE<s> and the rising edge RE<s-n> can be adjusted by assigning the specific DCDL delay step to be any desired value of the designer. Specifically, the delay difference between the rising edge RE<s> and the rising edge RE<s-n> can be adjusted by using different number of activated second stages in the second DCDL, but the disclosure is not limited thereto.

In FIG. 2, as mentioned in the above, the second reference clock signal RS2 can be used as the sampling clock signal for sampling the voltage of the second DCDL in each TDC unit. Specifically, for the rising edges occurs not later than the rising edge RS2a of the second reference clock signal RS2, the corresponding TDC code would be, for example, 1. On the other hand, for the rising edges occurs later than the rising edge RS2a of the second reference clock signal RS2, the corresponding TDC code would be, for example, 0.

In this case, if the rising edge RS2a of the second reference clock signal RS2 occurs between the rising edge RE<q> and RE<q−1> or aligns with the rising edge RE<q−1>, TDC<0> to TDC<q−1> of the TDC code combination would all be 1, and TDC<q> to TDC<63> of the TDC code combination would all be 0.

In the scenario of FIG. 2, since the rising edge RS2a of the second reference clock signal RS2 aligns with the rising edge RE<24>, TDC<0> to TDC<24> of the TDC code combination would all be 1, and TDC<25> to TDC<63> of the TDC code combination would all be 0, but the disclosure is not limited thereto.

As mentioned in the above, the to-be-monitored voltage can be the VDD (e.g., the operating voltage) applied to the DCDLs (e.g., the reference DCDL 12, the first DCDLs 131-13n, and the second DCDL in each TDC unit) mentioned in the application, and the TDC code combination varies in response to the voltage variation of the to-be-monitored voltage.

In this case, once the to-be-monitored voltage has a voltage variation, the delay of each DCDL in the disclosure would be affected.

In one embodiment, if the to-be-monitored voltage becomes lower, the delay of each DCDL in the disclosure would become longer, which makes all of the rising edges RE<0> to RE<63> occur later. For better understanding, the all of the rising edges RE<0> to RE<63> can be regarded as being shifted to the right of FIG. 2. In this case, the number of 1 s in the corresponding TDC code combination would be decreased, such that the corresponding TDC output code OC would become smaller.

On the other hand, if the to-be-monitored voltage becomes higher, the delay of each DCDL in the disclosure would become shorter, which makes all of the rising edges RE<0> to RE<63> occur earlier. For better understanding, the all of the rising edges RE<0> to RE<63> can be regarded as being shifted to the left of FIG. 2. In this case, the number of 1 s in the corresponding TDC code combination would be increased, such that the corresponding TDC output code OC would become larger.

Therefore, the voltage variation of the to-be-monitored voltage can be obtained by observing the variation of the TDC code combination and/or the TDC output code.

For observing the variation of the TDC output code, a reference TDC output code needs to be determined firstly. In the embodiments of the disclosure, the reference TDC output code can be understood as the TDC output code corresponding to the case where the to-be-monitored voltage has no voltage variation.

In the embodiments of the disclosure, it is assumed that the reference TDC output code is the TDC output code corresponding to the TDC code combination obtained when the rising edge RS2a of the second reference clock signal RS2 is aligned with a specific rising edge among the rising edges RE<0> to RE<m*n−1>, but the disclosure is not limited thereto.

In the embodiments of the disclosure, since the rising edge RS2a may be misaligned with the specific rising edge (e.g., the specific rising edge occurs before or after the rising edge RS2a), the calibration circuit 180 can use the calibration signal CC to calibrate the delay parameter used by the reference DCDL 12 for delaying the first reference clock signal RS1 in a calibration process of the VDM 100, such that the rising edge RS2a can be aligned with the specific rising edge.

Specifically, in one embodiment, the calibration circuit 180 may determine whether the TDC output code from the TDC decoder 170 matches the reference TDC output code. In one embodiment, in response to determining that the TDC output code from the TDC decoder 170 matches the reference TDC output code, it represents that the specific rising edge has been aligned with the rising edge RS2a. In this case, the calibration circuit 180 may determine that the calibration process of the VDM 100 has been finished and stop calibrating the delay parameter of the reference DCDL 12.

On the other hand, in response to determining that the TDC output code from the TDC decoder 170 fails to match the reference TDC output code, it represents that the specific rising edge is not aligned with the rising edge RS2a. In this case, the calibration circuit 180 may use the calibration signal CC to adjust the delay parameter used by the reference DCDL 12 for delaying the first reference clock signal RS1.

In one embodiment, in response to determining that the TDC output code is smaller than the reference TDC output code, it represents that the specific rising edge occurs earlier than the rising edge RS2a. In this case, the calibration circuit 180 can use the calibration signal CC to increase the delay parameter used by the reference DCDL 12 for delaying the first reference clock signal RS1, such that the specific rising edge can be delayed to be aligned with the rising edge RS2a.

On the other hand, in response to determining that the TDC output code is larger than the reference TDC output code, it represents that the specific rising edge occurs later than the rising edge RS2a. In this case, the calibration circuit 180 can use the calibration signal CC to decrease the delay parameter used by the reference DCDL 12 for delaying the first reference clock signal RS1, such that the specific rising edge can be brought forward to be aligned with the rising edge RS2a.

In FIG. 2, if the considered specific rising edge is the rising edge RE<24>, the calibration process of the VDM 100 can be determined to be finished since the rising edge RS2a has been aligned with the rising edge RE<24>.

In one embodiment, if the considered specific rising edge is some rising edge occurs earlier than the rising edge RS2a, the delay parameter used by the reference DCDL 12 needs to be increased for aligning the rising edge RS2a with the specific rising edge. For example, if the considered specific rising edge is the rising edge RE<16>, the delay parameter used by the reference DCDL 12 needs to be increased for delaying the rising edge RE<16> by the delay difference between the rising edge RE<16> and the rising edge RS2a, such that the rising edge RE<16> can be aligned with the rising edge RS2a.

In one embodiment, if the considered specific rising edge is some rising edge occurs later than the rising edge RS2a, the delay parameter used by the reference DCDL 12 needs to be decreased for aligning the rising edge RS2a with the specific rising edge. For example, if the considered specific rising edge is the rising edge RE<25>, the delay parameter used by the reference DCDL 12 needs to be decreased for bringing forward the rising edge RE<25> by the delay difference between the rising edge RE<25> and the rising edge RS2a, such that the rising edge RE<25> can be aligned with the rising edge RS2a.

In the embodiments of the disclosure, the resolution of the adjustment of the delay parameter is determined to be 1/n of the specific DCDL delay step (which is equal to the first delay difference TD1).

In some embodiments where the delay difference between the specific rising edge and the rising edge RS2a is not a multiple of the resolution, the specific rising edge may not be perfectly aligned with the rising edge RS2a. In this case, the resolution can be changed by adjusting the value of n and/or the specific DCDL delay step (which is determined based on the activated stage of the second stages of the second DCDL of each TDC unit as mentioned in the above). For example, if a smaller (i.e., finer) resolution needs to be achieved, n may be chosen to be a larger value and/or less of the second stages in the second DCCL can be activated, but the disclosure is not limited thereto.

In some embodiments, different applications can be determined to use different specific rising edges. For example, if the electronic device where the VDM 100 is disposed has multiple operating modes, the specific rising edges corresponding to the operating modes can be different and determined in advance. In different operating modes, the concept of DVFS (dynamic voltage and frequency scaling) can be used for heat/power control for each operating mode.

In addition, different operating modes can be designed with different mapping tables, wherein each mapping table can be used to record the corresponding relationships between the TDC output code and the corresponding voltage in the respective operating mode. Accordingly, when the electronic device is switched from one operating mode to another operating mode, the corresponding mapping table can be directly used without additional measurements, but the disclosure is not limited thereto.

Once the calibration process of the VDM 100 is determined to be finished, the VDM 100 can be used to monitor the voltage variation of the to-be-monitored voltage.

Figure 3A:
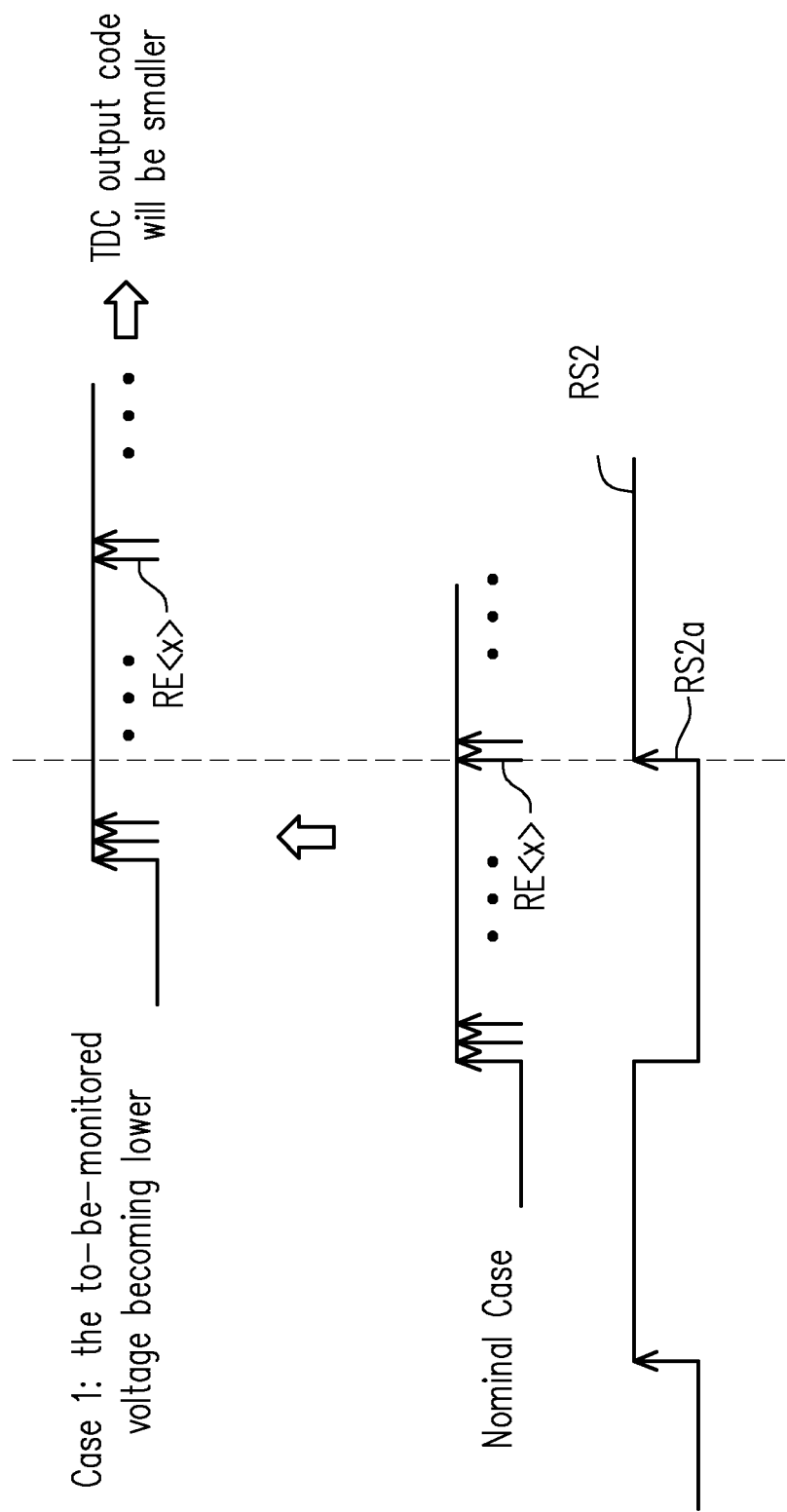
FIG. 3A shows the determination of the voltage variation of the to-be-monitored voltage according to an embodiment of the disclosure.

See FIG. 3A, which shows the determination of the voltage variation of the to-be-monitored voltage according to an embodiment of the disclosure.

In FIG. 3A, it is assumed that the rising edge RE<x> is the considered specific rising edge, and the rising edge RE<x> has been aligned with the rising edge RS2a in the nominal case. In this case, if the to-be-monitored voltage becomes lower, the delay of each DCDL mentioned in the disclosure would be larger, such that the rising edges RE<0> to RE<m*n−1> can be regarded as being shifted to the right of FIG. 3A. Accordingly, the corresponding TDC output code will be smaller than the reference TDC output code since the number of 1s in the TDC code combination is less.

Figure 3B:
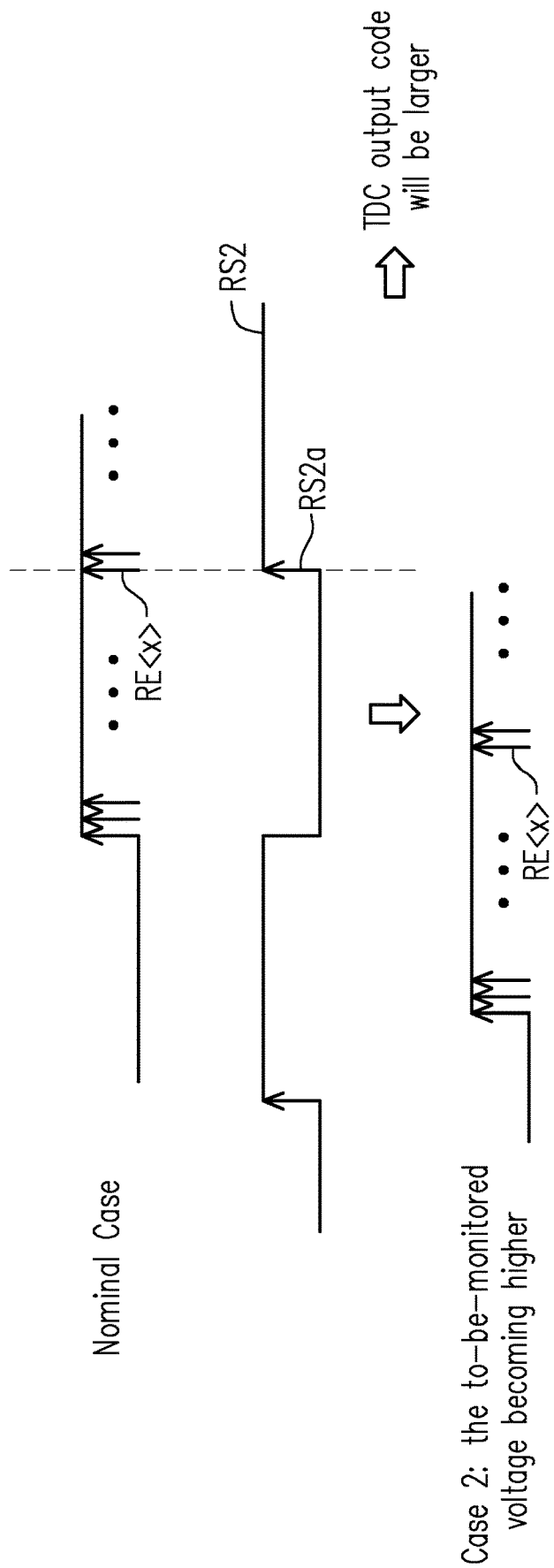
FIG. 3B shows the determination of the voltage variation of the to-be-monitored voltage according to an embodiment of the disclosure.

See FIG. 3B, which shows the determination of the voltage variation of the to-be-monitored voltage according to an embodiment of the disclosure.

In FIG. 3B, it is assumed that the rising edge RE<x> is the considered specific rising edge, and the rising edge RE<x> has been aligned with the rising edge RS2a in the nominal case. In this case, if the to-be-monitored voltage becomes higher, the delay of each DCDL mentioned in the disclosure would be smaller, such that the rising edges RE<0> to RE<m*n−1> can be regarded as being shifted to the left of FIG. 3B. Accordingly, the corresponding TDC output code will be larger than the reference TDC output code since the number of is in the TDC code combination is more.

In some embodiment, other circuit can be designed to perform further signal processing based on the voltage variation of the to-be-monitored voltage detected by the VDM 100.

In some embodiments, several exemplary choices of the combination of the design parameters of the VDM 100 may be shown in the following Table 1.

TABLE 1

| Example | m | n | number of first stages in the first DCDL | number of second stages in the second DCDL | Steps of PI | length of the TDC code combination |
|---|---|---|---|---|---|---|
| 1 | 4 | 4 | 9 | 8 | 4 | 16 |
| 2 | 8 | 8 | 9 | 8 | 8 | 64 |
| 3 | 16 | 8 | 5 | 4 | 8 | 128 |
| 4 | 8 | 16 | 17 | 16 | 16 | 128 |

To be specific, the length of the TDC code combination is m*n, the steps of PI is the same as n, and the number of first stages in the first DCDL is larger than the number of second stages in the second DCDL.

In the embodiments of the disclosure, the minimum resolution is determined by PI's step size, the maximum resolution is determined by the activated stages of the second DCDL and the unit delay of the second DCDL, and the maximum cover range is decided by a multiplication of m and the number of activated stages of the second stages in the second DCDL.

In some embodiments, some exemplary parameter settings of the VDM 100 can be shown in the following Table 2.

TABLE 2

| Scenario | number of activated second stages = 1 | | number of activated second stages = 2 | | number of activated second stages = 4 | |
|---|---|---|---|---|---|---|
| | first DCDL | PI | first DCDL | PI | first DCDL | PI |
| Row<1> | 1 | 6 | 1 | 5 | 1 | 7 |
| Row<2> | 1 | 7 | 1 | 7 | 2 | 3 |
| Row<3> | 2 | 0 | 2 | 1 | 2 | 7 |
| Row<4> | 2 | 1 | 2 | 3 | 3 | 3 |
| Row<5> | 2 | 2 | 2 | 5 | 3 | 7 |
| Row<6> | 2 | 3 | 2 | 7 | 4 | 3 |
| Row<7> | 2 | 4 | 3 | 1 | 4 | 7 |
| Row<8> | 2 | 5 | 3 | 3 | 5 | 3 |
| Resolution (in the unit of unit delay of the second DCDL) | ⅛ (min.) | | ¼ | | ½ (max.) | |
| Cover Range | 16 | | 32 | | 64 (max.) | |

In Table 2, it is assumed that m is 16, n is 8, and the number of the second stages in the second DCDL is 4. In this case, the minimum resolution will be ⅛ of the unit delay of the second DCDL, and the maximum resolution will be ½ of the unit delay of the second DCDL (i.e., the multiplication of 4 and the unit delay of the second DCDL). In addition, since the number of the second stages in the second DCDL is 4, the number of the first stages in the first DCDL may be, for example, 5, but the disclosure is not limited thereto.

In Table 2, Row<1> corresponds to the first DCDL 131 and PI 141, Row<2> corresponds to the first DCDL 132 and PI 142, Row<3> corresponds to the first DCDL 133 and PI 143, Row<4> corresponds to the first DCDL 134 and PI 144, Row<5> corresponds to the first DCDL 135 and PI 145, Row<6> corresponds to the first DCDL 136 and PI 146, Row<7> corresponds to the first DCDL 137 and PI 147, Row<8> corresponds to the first DCDL 138 and PI 148.

In addition, the number corresponding to the first DCDL is the number of activated first stage if the corresponding first DCDL, and the number corresponding to the PI is the number of the used step of the corresponding PI.

For example, when the number of activated second stage is 1, the resolution will be ⅛ of the unit delay of the second DCDL. In this case, when the number of the activated first stage in the first DCDL 131 is 1 and the used step of the PI 141 is 6, the number of the activated first stage in the first DCDL 132 would be 1 and the used step of the PI 142 would be 7 since the step difference between the PIs 141 and 142 is 1 step. In addition, the number of the activated first stage in the first DCDL 133 would be 2 and the used step of the PI 143 would be 0 since the step difference between the PIs 142 and 143 is also 1 step. Accordingly, the number of the activated first stages in the first DCDL 134-138 and the used step of the PIs 144-148 can be obtained based on the above teachings.

For example, when the number of activated second stage is 2, the resolution will be ¼ of the unit delay of the second DCDL. In this case, when the number of the activated first stage in the first DCDL 131 is 1 and the used step of the PI 141 is 5, the number of the activated first stage in the first DCDL 132 would be 1 and the used step of the PI 142 would be 7 since the step difference between the PIs 141 and 142 is 2 steps. In addition, the number of the activated first stage in the first DCDL 133 would be 2 and the used step of the PI 143 would be 1 since the step difference between the PIs 142 and 143 is also 2 steps. Accordingly, the number of the activated first stages in the first DCDL 134-138 and the used step of the PIs 144-148 can be obtained based on the above teachings.

For example, when the number of activated second stage is 4, the resolution will be ½ of the unit delay of the second DCDL. In this case, when the number of the activated first stage in the first DCDL 131 is 1 and the used step of the PI 141 is 7, the number of the activated first stage in the first DCDL 132 would be 2 and the used step of the PI 142 would be 3 since the step difference between the PIs 141 and 142 is 4 steps. In addition, the number of the activated first stage in the first DCDL 133 would be 2 and the used step of the PI 143 would be 7 since the step difference between the PIs 142 and 143 is also 4 steps. Accordingly, the number of the activated first stages in the first DCDL 134-138 and the used step of the PIs 144-148 can be obtained based on the above teachings.

Figure 4:
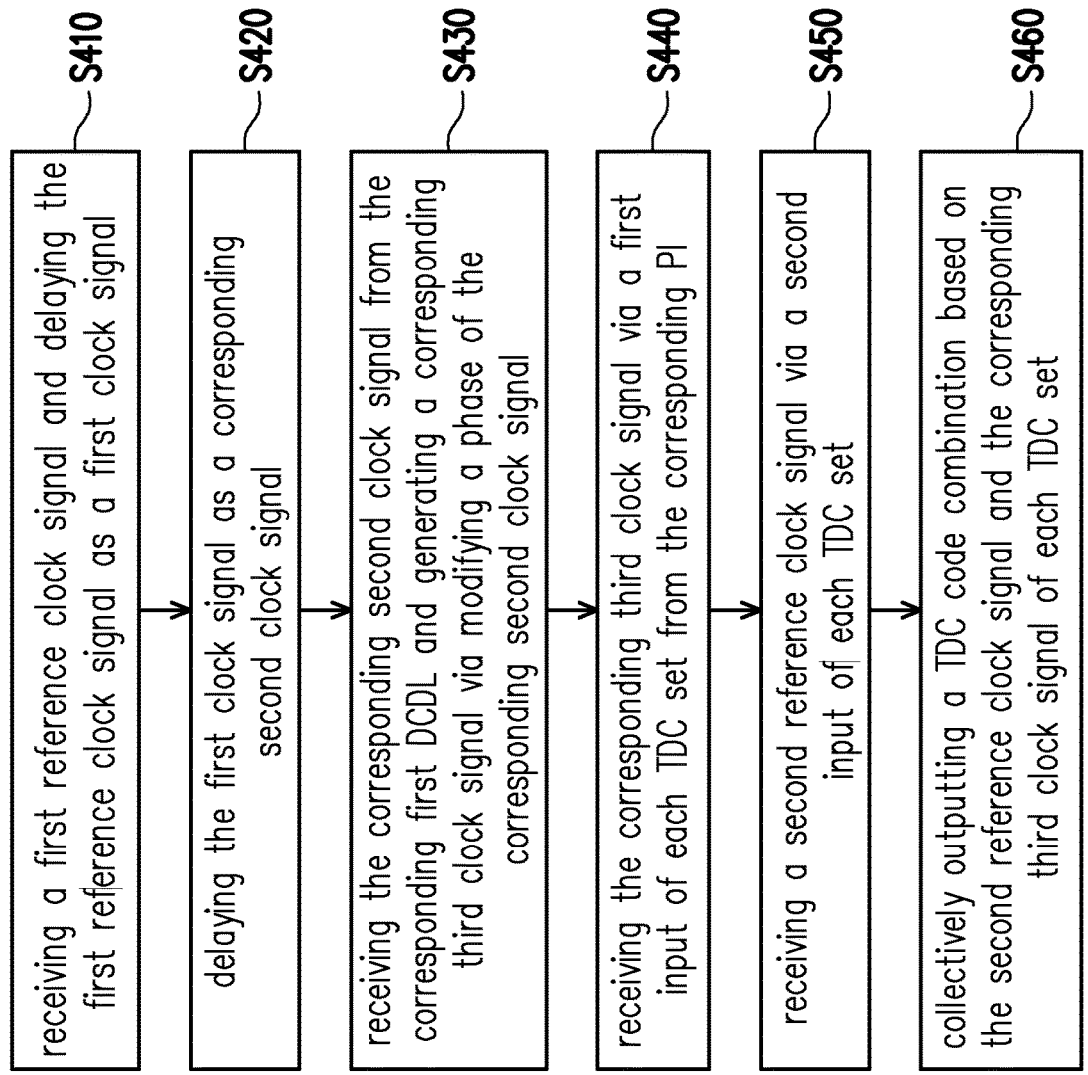
FIG. 4 shows a flow chart of a voltage droop monitoring method according to an embodiment of the disclosure.

See FIG. 4, which shows a flow chart of a voltage droop monitoring method according to an embodiment of the disclosure. The method of the embodiment can be performed by the TDM 100 in FIG. 1.

In step S410, the reference DCDL 12 receives a first reference clock signal RS1 and delaying the first reference clock signal RS1 as a first clock signal CS1.

In step S420, each of the first DCDLs 131-13n delays the first clock signal CS1 as a corresponding second clock signal.

In step S430, each of the PIs 141-14n receives the corresponding second clock signal from the corresponding first DCDL and generates a corresponding third clock signal via modifying a phase of the corresponding second clock signal.

In step S440, each of the TDC sets 151-15n receives the corresponding third clock signal via a first input of each TDC set from the corresponding PI.

In step S450, each of the TDC sets 151-15n receives a second reference clock signal RS2 via a second input of each TDC set.

In step S460, the TDC sets 151-15n collectively output a TDC code combination based on the second reference clock signal RS2 and the corresponding third clock signal of each TDC set, wherein the TDC code combination varies in response to a voltage variation of a to-be-monitored voltage.

The details of steps S410-S460 can be referred to the above teachings, which would not be repeated herein.

Figure 5:
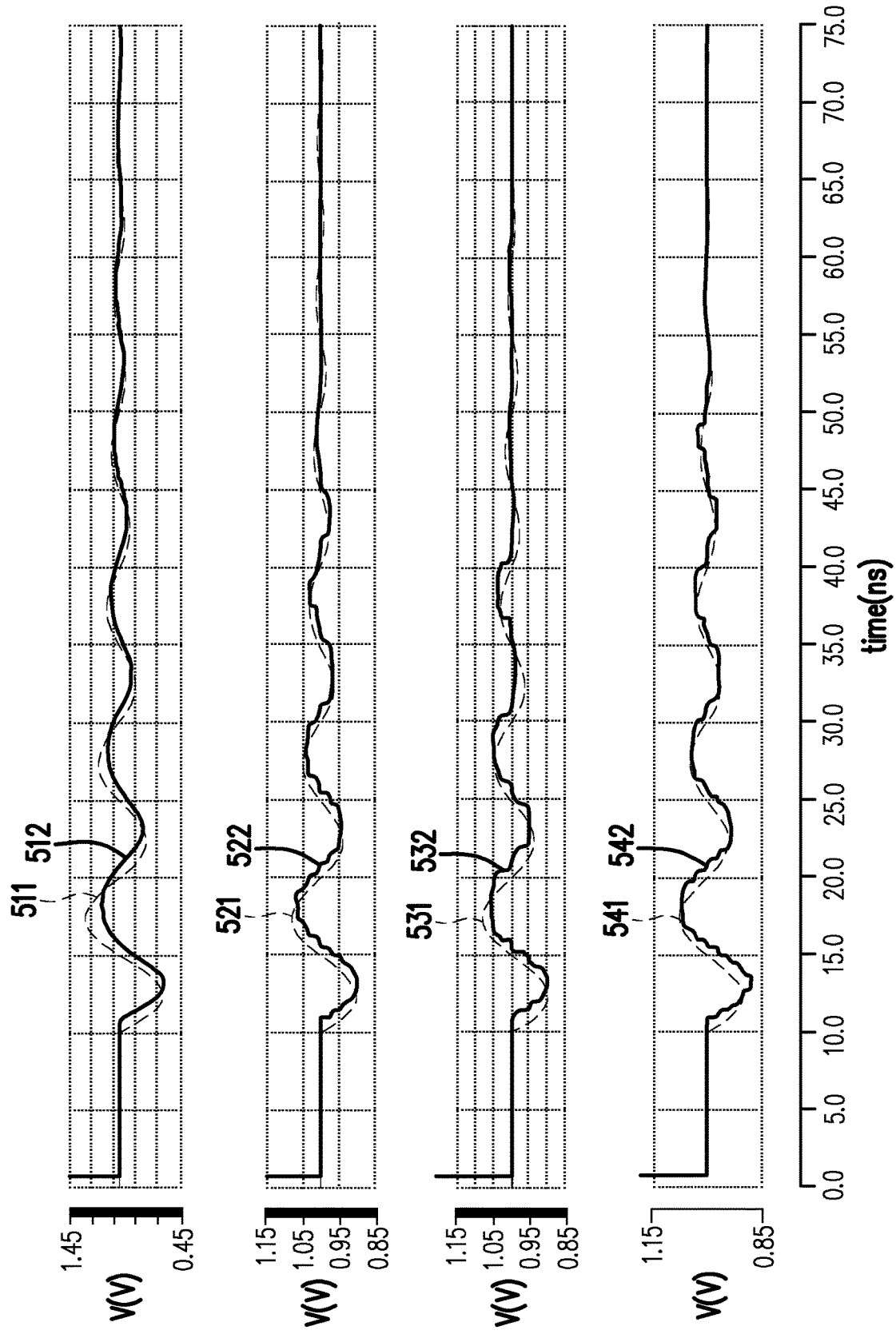
FIG. 5 shows a schematic diagram of the comparisons between the sensed to-be-monitored voltage and the voltage obtained based on the TDC output code according to different embodiments of the disclosure.

See FIG. 5, which shows a schematic diagram of the comparisons between the sensed to-be-monitored voltage and the voltage obtained based on the TDC output code according to different embodiments of the disclosure.

In FIG. 5, waveforms 511, 521, 531, 541 are the waveforms of the sensed to-be-monitored voltage in different applications, and waveforms 512, 522, 532, 542 are the waveforms of the voltage obtained based on the TDC output code.

As can be observed in FIG. 5, the variation trend of the waveforms 511 and 512 are similar, the variation trend of the waveforms 521 and 522 are similar, the variation trend of the waveforms 531 and 532 are similar, the variation trend of the waveforms 541 and 542 are similar. Accordingly, it can be understood that the TDC output code obtained via the embodiments of the disclosure can properly characterize the voltage variation of the to-be-monitored voltage.

In summary, the embodiments of the disclosure at least have the following novel points: (1) replacing reference voltage requirement to reference clock; (2) using delay line to check delay variation by TDC; (3) operation speed check capability for cycle-based design (such as CPU, GPU, SRAM . . . etc.); (4) voltage dependent delay tracking capability for TDC design; (5) scalable/adjustable resolution and cover range for different requirement; (6) taking interleaving architecture with PI to achieve finer resolution and higher sampling rate.

In addition, the embodiments of the disclosure at least have the following advantages: (1) digital-like approach decrease efforts and difficulty for process migration; (2) area scaling and porting friendly compared to analog approach; (3) user could estimate speed limitation of DUT (device under test) by TDC outputs and also system-level DVFS for heat/power control; (4) finer resolution of TDC could sense minor voltage (delay) change and support higher sampling rate (input clock).

In accordance with some embodiments, a VDM including a reference DCDL, a plurality of first DCDL, a plurality of PIs, and a plurality of TDC sets is introduced. The reference DCDL receives a first reference clock signal and delaying the first reference clock signal as a first clock signal. The first DCDLs are coupled to the reference DCDL, wherein each first DCDL delays the first clock signal as a corresponding second clock signal. The PIs are respectively coupled to the first DCDLs, each PI receives the corresponding second clock signal from the corresponding first DCDL and generates a corresponding third clock signal via modifying a phase of the corresponding second clock signal. The TDC sets respectively corresponds to the PIs, a first input of each TDC set is coupled to the corresponding PI and receives the corresponding third clock signal, and a second input of each TDC set receives a second reference clock signal, wherein the TDC sets collectively output a TDC code combination based on the second reference clock signal and the corresponding third clock signal of each TDC set, and the TDC code combination varies in response to a voltage variation of a to-be-monitored voltage.

In accordance with some embodiments, a VDM including a reference DCDL, a plurality of first DCDL, a plurality of PIs, and a plurality of TDC sets is introduced. The reference DCDL receives a first reference clock signal and delaying the first reference clock signal as a first clock signal. The first DCDLs are coupled to the reference DCDL, wherein each first DCDL delays the first clock signal as a corresponding second clock signal. The PIs are respectively coupled to the first DCDLs, each PI receives the corresponding second clock signal from the corresponding first DCDL and generates a corresponding third clock signal via modifying a phase of the corresponding second clock signal. The TDC sets respectively corresponds to the PIs, a first input of each TDC set is coupled to the corresponding PI and receives the corresponding third clock signal, and a second input of each TDC set receives a second reference clock signal, wherein the TDC sets collectively output a TDC code combination based on the second reference clock signal and the corresponding third clock signal of each TDC set, and the TDC code combination varies in response to a voltage variation of a to-be-monitored voltage. Each TDC set includes a plurality of serially connected TDC units and a reference D-flip flop, wherein the D-flip flop is connected to a last TDC units among the serially connected TDC units.

In accordance with some embodiments, a voltage droop monitoring method is introduced. The method includes: receiving, by a reference digitally-controlled delay line (DCDL), a first reference clock signal and delaying the first reference clock signal as a first clock signal; delaying, by each of a plurality of first DCDLs, the first clock signal as a corresponding second clock signal; receiving, by each of a plurality of phase interpolators (PI), the corresponding second clock signal from the corresponding first DCDL and generating, by each PI, a corresponding third clock signal via modifying a phase of the corresponding second clock signal; receiving, by each of a plurality of time-to-digital converter (TDC) sets, the corresponding third clock signal via a first input of each TDC set from the corresponding PI; receiving, by each TDC set, a second reference clock signal via a second input of each TDC set; and collectively outputting, by the TDC sets, a TDC code combination based on the second reference clock signal and the corresponding third clock signal of each TDC set, wherein the TDC code combination varies in response to a voltage variation of a to-be-monitored voltage.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A voltage droop monitor (VDM), comprising:
a reference digitally-controlled delay line (DCDL), receiving a first reference clock signal and delaying the first reference clock signal as a first clock signal;
a plurality of first DCDLs, coupled to the reference DCDL, wherein each first DCDL delays the first clock signal as a corresponding second clock signal;
a plurality of phase interpolators (PI), wherein the PIs are respectively coupled to the first DCDLs, each PI receives the corresponding second clock signal from the corresponding first DCDL and generates a corresponding third clock signal via modifying a phase of the corresponding second clock signal;
a plurality of time-to-digital converter (TDC) sets, wherein the TDC sets respectively corresponds to the PIs, a first input of each TDC set is coupled to the corresponding PI and receives the corresponding third clock signal, and a second input of each TDC set receives a second reference clock signal, wherein the TDC sets collectively output a TDC code combination based on the second reference clock signal and the corresponding third clock signal of each TDC set, and the TDC code combination varies in response to a voltage variation of a to-be-monitored voltage.

2. The VDM according to claim 1, further comprising:
a TDC decoder, coupled to an output of each TDC set, receiving the TDC code combination and a phase locked loop (PLL) clock signal, and converts the TDC code combination into a TDC output code corresponding to the to-be-monitored voltage.

3. The VDM according to claim 2, further comprising:
a calibration circuit, coupled to the TDC decoder, wherein the calibration circuit receives the TDC output code and the PLL clock signal, and accordingly provides a calibration signal to the reference DCDL, wherein the calibration signal calibrates a delay parameter used by the reference DCDL for delaying the first reference clock signal.

4. The VDM according to claim 3, further comprising:
a first integrated clock signal gating (ICG) cell, coupled to the TDC sets and the calibration circuit, receiving the PLL clock signal, and retrieving a first pulse from the PLL clock signal as the second reference clock signal;
a second ICG cell, receiving the PLL clock signal and the calibration signal, and retrieving a plurality of second pulses from the PLL clock signal as the first reference clock signal based on the calibration signal.

5. The VDM according to claim 3, wherein the calibration circuit is configured to perform:
in response to determining that the TDC output code from the TDC decoder matches a reference TDC output code, determining that a calibration process of the VDM has been finished.

6. The VDM according to claim 5, wherein the calibration circuit is further configured to perform:
in response to determining that the TDC output code fails to match the reference TDC output code, using the calibration signal to adjust the delay parameter used by the reference DCDL for delaying the first reference clock signal.

7. The VDM according to claim 6, wherein the calibration circuit is configured to perform:
in response to determining that the TDC output code is smaller than the reference TDC output code, using the calibration signal to increase the delay parameter used by the reference DCDL for delaying the first reference clock signal;
in response to determining that the TDC output code is larger than the reference TDC output code, using the calibration signal to decrease the delay parameter used by the reference DCDL for delaying the first reference clock signal.

8. The VDM according to claim 1, wherein each PI modifies the phase of the corresponding second clock signal based on a corresponding phase step, wherein the corresponding phase step of an i-th PI among the PIs is $(i-1)/n$ of a specific DCDL delay step, wherein i is an integer ranges from 1 to n, and n is a number of the PIs.

9. The VDM according to claim 8, wherein each TDC set comprises:
a plurality of serially connected TDC units; and
a reference D-flip flop, connected to a last TDC units among the serially connected TDC units.

10. The VDM according to claim 9, wherein a j-th TDC unit of a k-th TDC set comprises:
a second DCDL, receiving a specific clock signal and delaying the specific clock signal, wherein j is an integer ranges from 1 to m, k is an integer ranges from 1 to n−1, m is a number of the TDC units in each TDC set;
a D-flip flop, outputting one TDC code of the TDC code combination in response to the specific clock signal and the second reference clock signal.

11. The VDM according to claim 10, wherein in a first case where j is 1, the specific clock signal is the corresponding third clock signal provided by the corresponding PI;
in a second case where j is between 2 and m, the specific clock signal is an outputted clock signal from the second DCDL of a (j−1)-th TDC unit of the k-th TDC set.

12. The VDM according to claim 10, wherein each first DCDL comprises a plurality of first stages, the second DCDL comprise a plurality of second stages, and a number of the first stages is larger than a number of the second stages.

13. The VDM according to claim 12, wherein the specific DCDL delay step is determined based on at least one activated stage of the second stages of the second DCDL.

14. The VDM according to claim 13, wherein the specific DCDL delay step is a multiplication of a number of the at least one activated stage, a unit delay of the second DCDL, and 1/n.

15. A voltage droop monitor (VDM), comprising:
a reference digitally-controlled delay line (DCDL), receiving a first reference clock signal and delaying the first reference clock signal as a first clock signal;
a plurality of first DCDLs, coupled to the reference DCDL and delaying the first clock signal as a corresponding second clock signal;
a plurality of phase interpolators (PI), wherein the PIs are respectively coupled to the first DCDLs, each PI receives the corresponding second clock signal from the corresponding first DCDL and generates a corresponding third clock signal via modifying a phase of the corresponding second clock signal;
a plurality of time-to-digital converter (TDC) sets, wherein the TDC sets respectively corresponds to the PIs, a first input of each TDC set is coupled to the corresponding PI and receives the corresponding third clock signal, and a second input of each TDC set receives a second reference clock signal, wherein the TDC sets collectively output a TDC code combination based on the second reference clock signal and the corresponding third clock signal of each TDC set, and the TDC code combination varies in response to a voltage variation of a to-be-monitored voltage, wherein each TDC set comprises:
a plurality of serially connected TDC units; and
a reference D-flip flop, connected to a last TDC units among the serially connected TDC units.

16. The VDM according to claim 15, further comprising:
a TDC decoder, coupled to an output of each TDC set, receiving the TDC code combination and a phase locked loop (PLL) clock signal, and converts the TDC code combination into a TDC output code corresponding to the to-be-monitored voltage.

17. The VDM according to claim 16, further comprising:
a calibration circuit, coupled to the TDC decoder, wherein the calibration circuit receives the TDC output code and the PLL clock signal, and accordingly provides a calibration signal to the reference DCDL, wherein the calibration signal calibrates a delay parameter used by the reference DCDL for delaying the first reference clock signal.

18. The VDM according to claim 17, wherein the calibration circuit is configured to perform:
determining a reference TDC output code;
in response to determining that the TDC output code from the TDC decoder matches the reference TDC output code, determining that a calibration process of the VDM has been finished.

19. The VDM according to claim 18, wherein the calibration circuit is further configured to perform:
in response to determining that the TDC output code fails to match the reference TDC output code, using the calibration signal to adjust the delay parameter used by the reference DCDL for delaying the first reference clock signal.

20. A voltage droop monitoring method, comprising:
receiving, by a reference digitally-controlled delay line (DCDL), a first reference clock signal and delaying the first reference clock signal as a first clock signal;
delaying, by each of a plurality of first DCDLs, the first clock signal as a corresponding second clock signal;
receiving, by each of a plurality of phase interpolators (PI), the corresponding second clock signal from the corresponding first DCDL and generating, by each PI, a corresponding third clock signal via modifying a phase of the corresponding second clock signal;
receiving, by each of a plurality of time-to-digital converter (TDC) sets, the corresponding third clock signal via a first input of each TDC set from the corresponding PI;
receiving, by each TDC set, a second reference clock signal via a second input of each TDC set; and
collectively outputting, by the TDC sets, a TDC code combination based on the second reference clock signal and the corresponding third clock signal of each TDC set, wherein the TDC code combination varies in response to a voltage variation of a to-be-monitored voltage.

* * * * *